US009252081B2

(12) United States Patent
Ide

(10) Patent No.: US 9,252,081 B2
(45) Date of Patent: Feb. 2, 2016

(54) SEMICONDUCTOR DEVICE HAVING PLURAL MEMORY CHIP

(71) Applicant: PS4 Luxco S.a.r.l., Luxembourg (LU)

(72) Inventor: Akira Ide, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/560,493

(22) Filed: Dec. 4, 2014

(65) Prior Publication Data

US 2015/0084166 A1 Mar. 26, 2015

Related U.S. Application Data

(63) Continuation of application No. 13/288,631, filed on Nov. 3, 2011, now Pat. No. 8,924,903.

(30) Foreign Application Priority Data

Nov. 30, 2010 (JP) ................. 2010-266589

(51) Int. Cl.
*G06F 17/50* (2006.01)
*H01L 23/48* (2006.01)
*G11C 5/04* (2006.01)
*H01L 23/50* (2006.01)
*H01L 25/065* (2006.01)

(52) U.S. Cl.
CPC ............... *H01L 23/481* (2013.01); *G11C 5/04* (2013.01); *H01L 23/50* (2013.01); *H01L 25/0657* (2013.01); *H01L 2224/16145* (2013.01)

(58) Field of Classification Search
CPC .................................... H01L 25/0657

USPC ................................... 716/100, 110
See application file for complete search history.

(56) References Cited

U.S. PATENT DOCUMENTS

| 6,442,717 | B1 | 8/2002 | Kim |
| 6,448,661 | B1 | 9/2002 | Kim et al. |
| 6,791,175 | B2 | 9/2004 | Matsuo et al. |
| 8,537,634 | B2 | 9/2013 | Muralimanohar et al. |
| 2001/0053105 | A1* | 12/2001 | Elliott et al. ................. 365/223 |
| 2002/0109236 | A1 | 8/2002 | Kim et al. |
| 2003/0062612 | A1 | 4/2003 | Matsuo et al. |
| 2006/0267212 | A1 | 11/2006 | Shibata et al. |
| 2008/0168316 | A1 | 7/2008 | Cho et al. |
| 2009/0070721 | A1 | 3/2009 | Solomon |
| 2009/0141545 | A1* | 6/2009 | Norman ....................... 365/163 |

(Continued)

FOREIGN PATENT DOCUMENTS

| JP | 2002-305283 | 10/2002 |
| JP | 2003-110086 | 4/2003 |

(Continued)

*Primary Examiner* — Suchin Parihar

(57) ABSTRACT

A semiconductor device includes a stacked plurality of memory chips. The memory chips each include a plurality of memory banks, a plurality of read/write buses that are assigned to the respective memory banks, and a plurality of penetration electrodes that are assigned to the respective read/write buses and arranged through the memory chip. Penetration electrodes arranged in the same positions as seen in a stacking direction are connected in common between the chips. In response to an access request, the memory chips activate the memory banks that are arranged in respective different positions as seen in the stacking direction, whereby data is simultaneously input/output via the penetration electrodes that lie in different planar positions.

11 Claims, 15 Drawing Sheets

(56) References Cited

U.S. PATENT DOCUMENTS

| | | |
|---|---|---|
| 2009/0196109 A1* | 8/2009 | Walker ............... 365/189.07 |
| 2009/0213645 A1 | 8/2009 | Parkinson et al. |
| 2009/0303770 A1 | 12/2009 | Shibata |
| 2010/0078790 A1* | 4/2010 | Ito et al. ............... 257/686 |
| 2010/0095168 A1 | 4/2010 | Jeddeloh |
| 2011/0044084 A1* | 2/2011 | Chung et al. ............... 365/51 |
| 2011/0050320 A1* | 3/2011 | Gillingham ............... 327/365 |
| 2011/0084722 A1* | 4/2011 | Nishioka ............... 324/762.01 |
| 2011/0258373 A1 | 10/2011 | Miura et al. |
| 2012/0017065 A1 | 1/2012 | Muralimanohar |
| 2012/0092943 A1* | 4/2012 | Nishioka ............... 365/191 |
| 2012/0124251 A1 | 5/2012 | Hnatko et al. |
| 2012/0248600 A1* | 10/2012 | Shigezane et al. ............. 257/737 |
| 2012/0320654 A1* | 12/2012 | Yoko ............... 365/63 |
| 2013/0032950 A1 | 2/2013 | Ware et al. |
| 2013/0121092 A1* | 5/2013 | Ogasawara ............. 365/189.15 |
| 2014/0141543 A1 | 5/2014 | Ide et al. |
| 2014/0185352 A1 | 7/2014 | Chow et al. |
| 2014/0192583 A1* | 7/2014 | Rajan et al. ............... 365/63 |

FOREIGN PATENT DOCUMENTS

| | | |
|---|---|---|
| JP | 2004-327474 | 11/2004 |
| JP | 2008-140220 | 6/2008 |
| JP | 2009-027073 | 2/2009 |
| JP | 2010-182368 | 8/2010 |

* cited by examiner

US 9,252,081 B2

SEMICONDUCTOR DEVICE HAVING PLURAL MEMORY CHIP

This application is a continuation of U.S. patent application Ser. No. 13/288,631, filed Nov. 3, 2011, which is based upon and claims the benefit of priority from Japanese Patent Application No. 2010-266589, filed on Nov. 30, 2010, the contents of which prior applications are incorporated herein in their entirety by reference.

BACKGROUND OF THE INVENTION

1. Field of the Invention

The present invention relates to a semiconductor device, and more particularly to a semiconductor device includes a stacked plurality of semiconductor memory chips.

2. Description of Related Art

Storage capacities required to semiconductor memories such as a dynamic random access memory (DRAM) have been increasing year by year. To satisfy such a request, a semiconductor memory device called multi-chip package has recently been proposed in which a plurality of memory chips are stacked on each other. In a multi-chip package, wirings for connecting a memory chip with the package substrate need to be provided each memory chip. This makes it difficult to stack a large number of memory chips.

In view of this, there has recently been proposed a type of semiconductor device in which a plurality of memory chips having through silicon vias are stacked (see Japanese Patent Application Laid-Open Nos. 2002-305283 and 2003-110086). In such a type of semiconductor device, through silicon vias that are located in the same planar positions as seen in the stacking direction formed in the memory chips are electrically short-circuited to one another. This prevents the number of electrodes to be connected to the package substrate from increasing even if the number of stacked memory chips increases. It is therefore possible to stack a greater number of memory chips.

In such a semiconductor device of stacked type using through silicon vias, an address space may extend because of increasing a storage capacity. For example, a stack of eight memory chips may be handled as a large-capacity chip having an address space eight times that of a single memory chip. In such a case, the through silicon vias connected in common between the memory chips are used in a time sharing manner since different memory chips are selected by respective accesses. There occurs no data conflict on the through silicon vias.

An increase in storage capacity due to stacking may also be used to extend the data input/output width instead of address extension. For example, eight memory chips each having eight data input/output terminals can be stacked to implement a data input/output width of 64 bits. Such a semiconductor device may be handled as a single memory module.

When the data input/output width is extended, the memory chips need to transfer data via respective different through silicon vias since all the memory chips are selected for every access. In this case, the same address signal is supplied to all the memory chips. In a read operation, for example, read data supplied from memory banks located in the same planar positions as seen from the stacking direction therefore need to be distributed so as to supply the read data to different through silicon vias chip by chip. The read/write buses connected between the memory banks and the through silicon vias need to be provided in equal lengths with respect to each memory bank. Distributing the read data to different through silicon vias chip by chip therefore has the problem of not only increasing the number of read/write buses required but also increasing the wiring lengths significantly.

SUMMARY

In one embodiment, there is provided a semiconductor device that includes a plurality of memory chips stacked to each other, each of the memory chips including a plurality of memory banks, a plurality of read/write buses each transferring data to/from an associated one of the memory banks, and a plurality of penetration electrodes each transferring the data to/from an associated one of the read/write buses and arranged penetrating through the memory chip, the penetration electrodes arranged in the same positions as seen in a stacking direction of the memory chips being coupled in common between the memory chips, and each one of the memory banks included in the memory chips being activated in response to an access request so that the activated memory banks are arranged in respective different positions as seen in the stacking direction, thereby the data are simultaneously transferred via the penetration electrodes in parallel.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
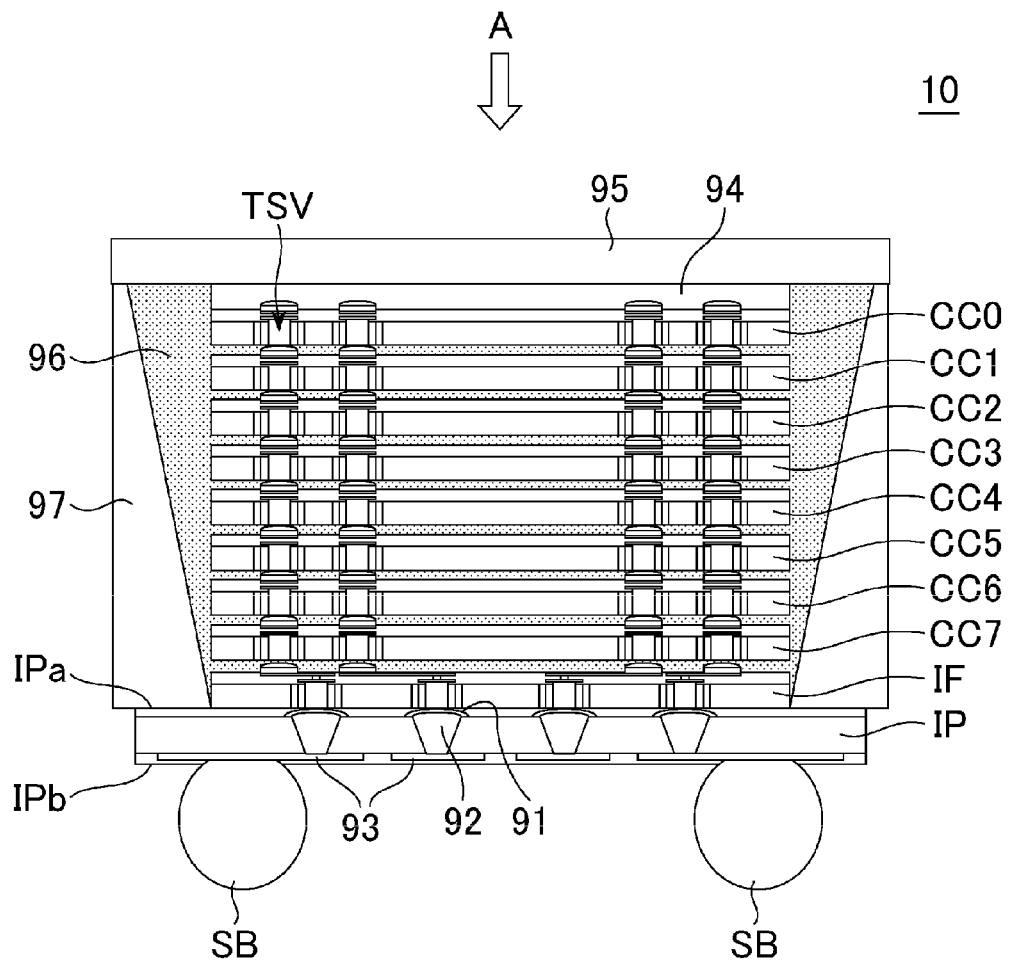
FIG. 1 is a schematic cross-sectional view illustrating the structure of a semiconductor memory device according to the preferred embodiment of the present invention.

Referring now to FIG. 1, the semiconductor device 10 according to this embodiment has the structure where eight core chips (memory chips) CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon vias may be referred to as penetration electrodes. Meanwhile, the interposer IP is a circuit board that is made of a resin, and plural external terminals (solder balls) SB are formed in aback surface IPb of the interposer IP.

Each of the core chips CC0 to CC7 is a semiconductor chip which consists of circuit blocks other than a so-called front end unit having a front end function performing a function of an interface with an external device through an external terminal among circuit blocks included in an ordinary SDRAM (Synchronous Dynamic Random Access Memory). The SDRAM operates even as a single chip and is capable to communicate directly with a memory controller. As the circuit blocks that are included in the front end unit, a parallel-serial converting circuit having a data latch circuit that performs parallel/serial conversion on input/output data between a memory cell array and a data input/output terminal and a DLL (Delay Locked Loop) circuit that controls input/output timing of data are exemplified, which will be described in detail below.

The interface chip IF is a semiconductor chip into which only the front end unit included in an ordinary SDRAM is integrated. The interface chip IF functions as a common front end unit for the eight core chips CC0 to CC7. Accordingly, all external accesses are performed through the interface chip IF and inputs/outputs of data are also performed through the interface chip IF.

In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon vias TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the SDRAM that is determined by the regulation. Accordingly, the semiconductor device 10 can be treated as one SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
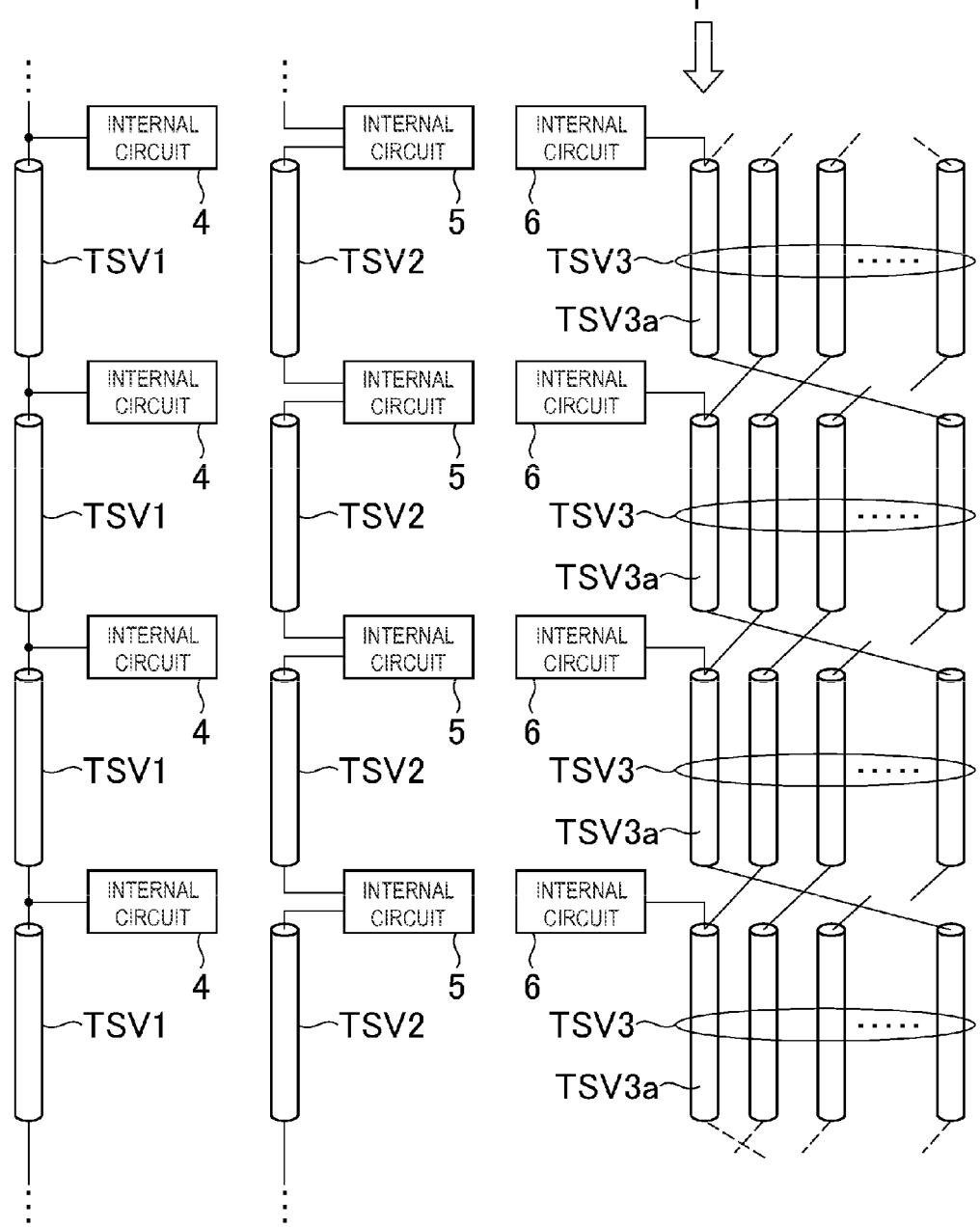
FIGS. 2A to 2C are diagrams showing the various types of through silicon vias TSV provided in a core chip.

When most of the through silicon vias TSV provided in the core chips CC0 to CC7 viewed from a lamination direction, that is, viewed from an arrow A shown in FIG. 1, are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon vias TSV1. The through silicon vias TSV1 that are provided in each of the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly supplied to the internal circuits 4 of the core chips CC0 to CC7. Output signals (data etc.) that are supplied from the core chips CC0 to CC7 to the through silicon vias TSV1 are wired-ORed and supplied to the interface chip IF.

Meanwhile, as shown in FIG. 2B, another through silicon vias TSV2 are not directly connected to the through silicon vias TSV2 of other layers provided at the same position in plain view but are connected to the through silicon vias TSV2 of other layers through the internal circuits 5 provided in the core chips CC0 to CC7. That is, the internal circuits 5 that are provided in the core chips CC0 to CC7 are cascade-connected through the through silicon vias TSV2. This kind of through silicon vias TSV2 are used to sequentially transmit predetermined information to the internal circuits 5 provided in the core chips CC0 to CC7. As this information, chip address information to be described below is exemplified.

Still another through silicon vias TSV3 are short-circuited to the through silicon vias TSV3 of other layer provided at the different position in plan view, as shown in FIG. 2C. With respect to this kind of through silicon vias TSV3, internal circuits 6 of the core chips CC0 to CC7 are connected to the TSV3a provided at the predetermined position P in plain view. Thereby, information can be selectively supplied to the internal circuits 6 provided in the core chips. As this information, defective chip information is exemplified.

As such, as types of the through silicon vias TSVs provided in the core chips CC0 to CC7, three types (TSV1 to TSV3) shown in FIGS. 2A to 2C exist. As described above, most of the through silicon vias TSVs are of a type shown in FIG. 2A, and an address signal, a command signal, and a clock signal are supplied from the interface chip IF to the core chips CC0 to CC7, through the through silicon vias TSV1 of the type shown in FIG. 2A. Read data and write data are input to and output from the interface chip IF through the through silicon vias TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
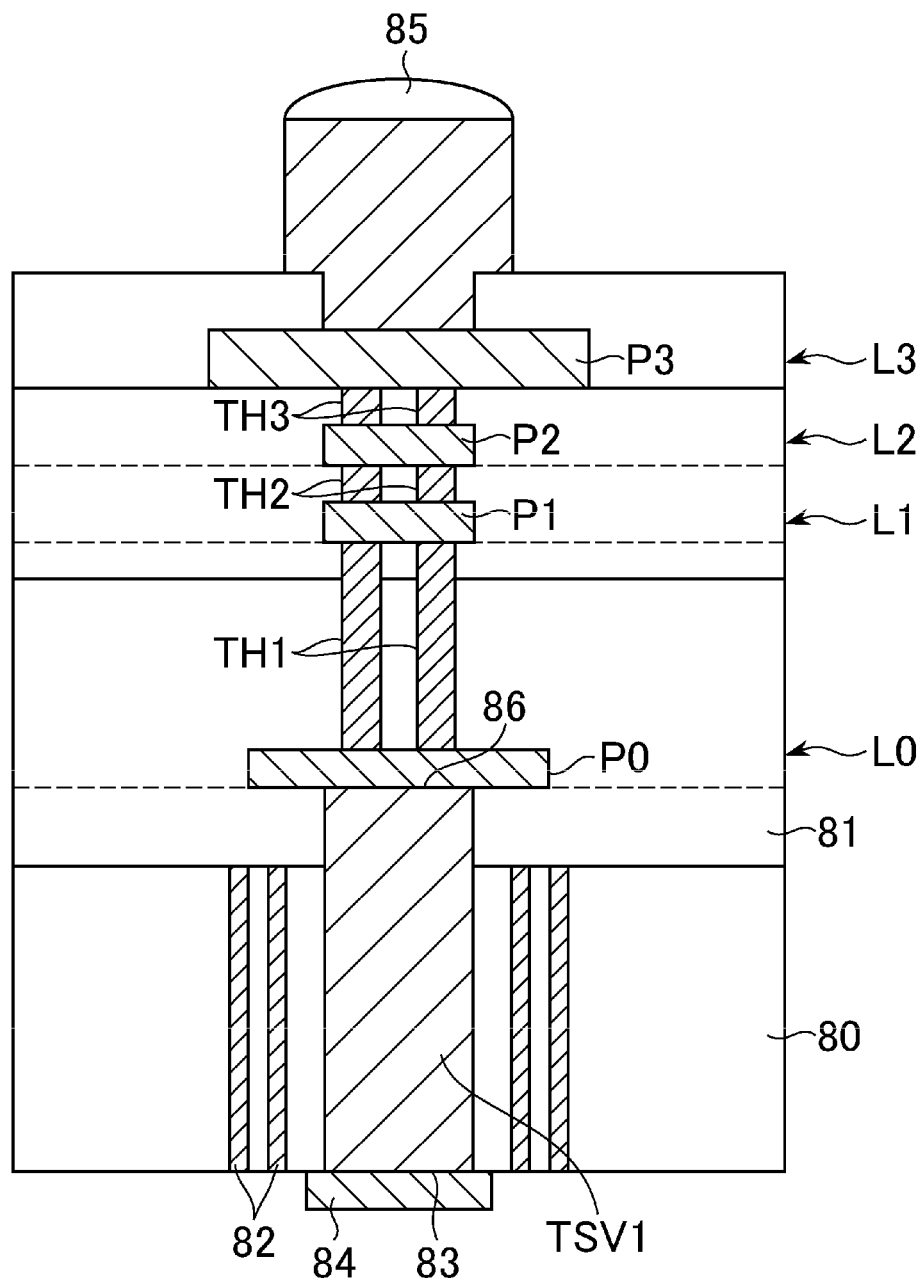
FIG. 3 is a cross-sectional view illustrating the structure of the through silicon via TSV1 of the type shown in FIG. 2A.

Turning to FIG. 3, the through silicon vias TSV1 is provided to penetrate a silicon substrate 80 and an interlayer insulating film 81 provided on a surface of the silicon substrate 80. Around the through silicon vias TSV1, an insulating ring 82 is provided. Thereby, the TSV1 and a transistor region are insulated from each other. In an example shown in FIG. 3, the insulating ring 82 is provided double. Thereby, capacitance between the through silicon vias TSV1 and the silicon substrate 80 is reduced.

An end 83 of the through silicon vias TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon vias TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
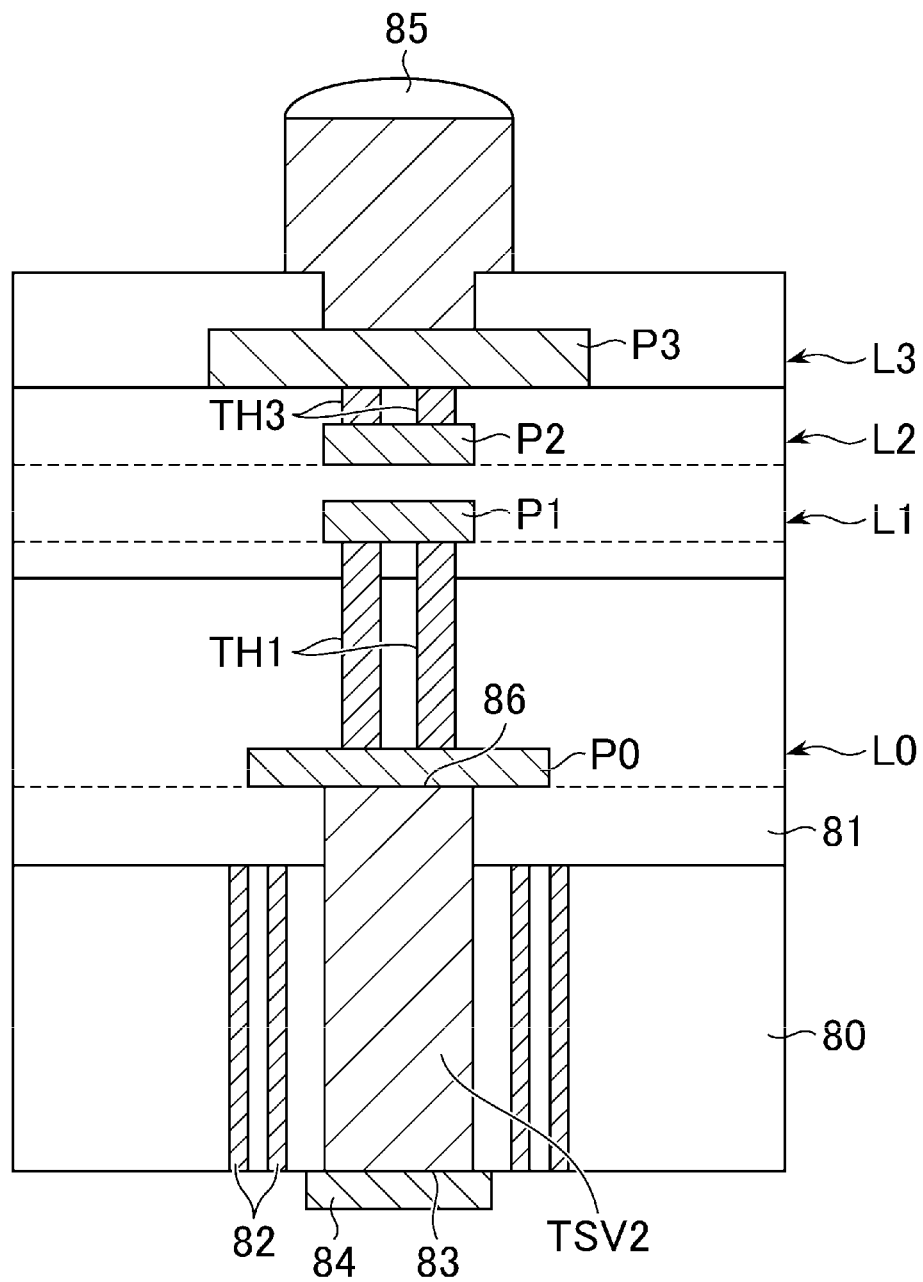
FIG. 4 is a cross-sectional view illustrating the structure of the through silicon via TSV2 of the type shown in FIG. 2B.

Turning to FIG. 4, the through silicon via TSV2 differs from the through silicon via TSV1 shown in FIG. 3 in the omission of the through-hole electrodes TH2 which directly connect the pad P1 and the pad P2 lying in the same planar position. The pad P1 is connected to, for example, the output node of an internal circuit 5 shown in FIG. 2B. The pad P2 is connected to, for example, the input node of the internal circuit 5 shown in FIG. 2B. The internal circuits 5 arranged in the core chips CC0 to CC7 are thus cascaded through the intervention of through silicon vias TSV2.

Figure 5:
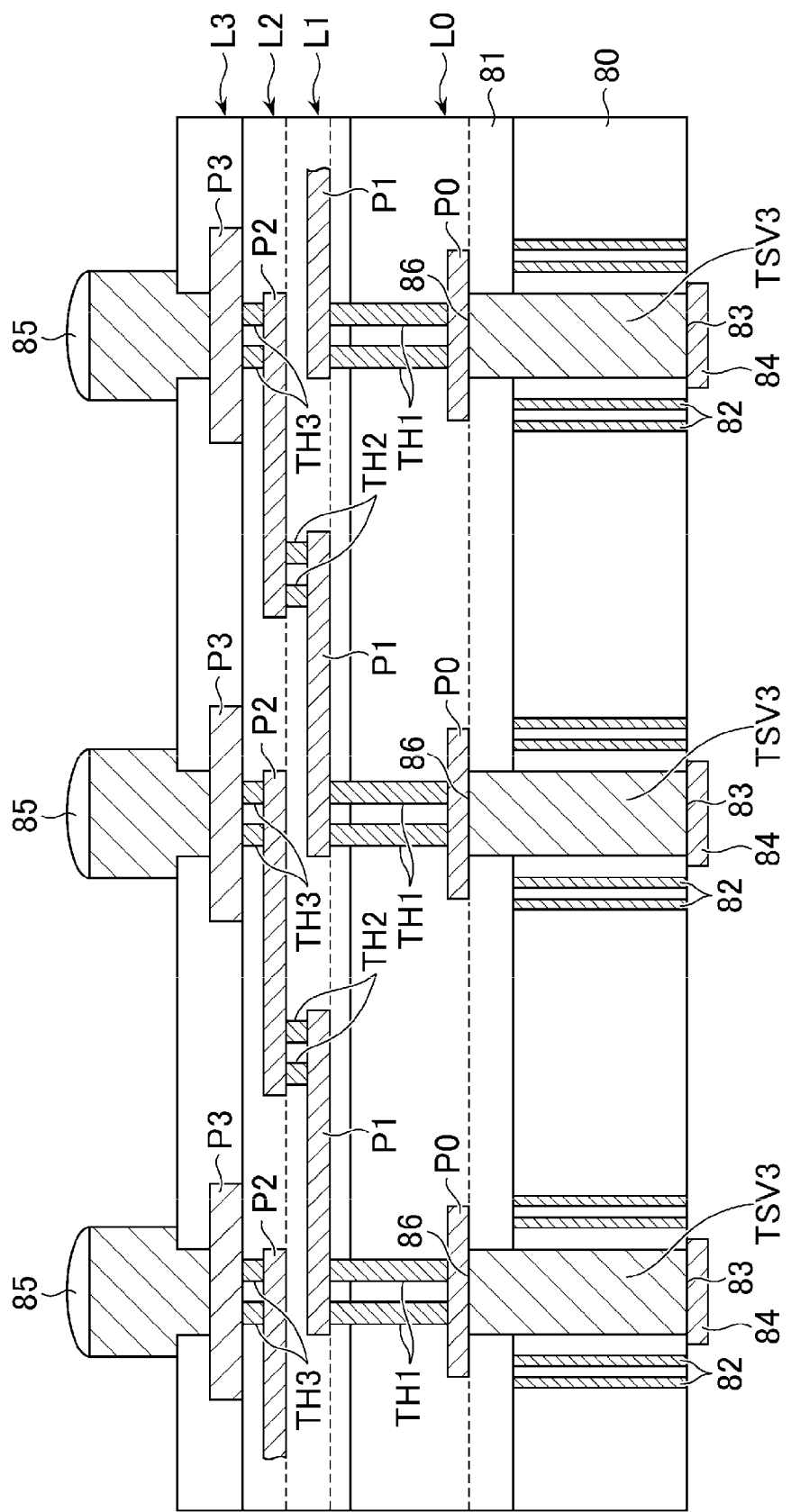
FIG. 5 is a cross-sectional view illustrating the structure of the through silicon vias TSV3 of the type shown in FIG. 2C.
Figure 6:
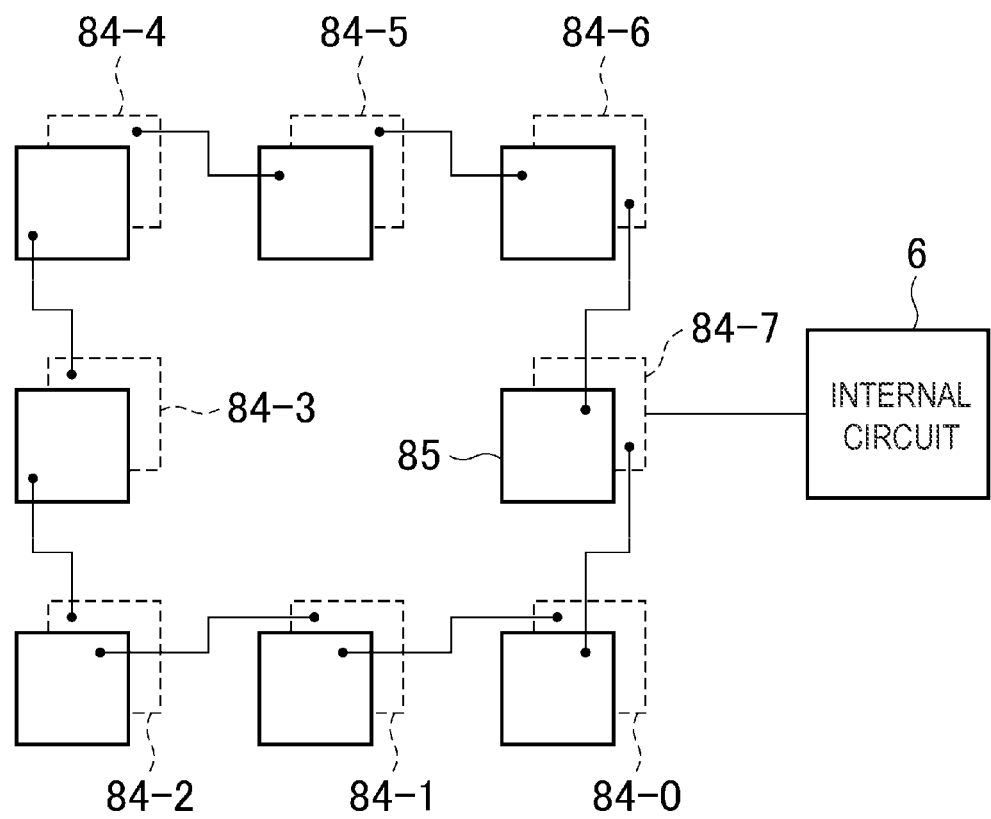
FIG. 6 is a schematic diagram explaining the cyclic connection of the through silicon vias TSV3.

Turning to FIG. 5, the through silicon vias TSV3 are configured not so that the pads P1 and P2 formed in the same planar positions are connected by through-hole electrodes TH2, but so that pads P1 and P2 formed in different planar positions are connected by through-hole electrodes TH2. While FIG. 5 shows only three through silicon vias TSV3, there are provided through silicon vias TSV3 as many as the number of core chips CC0 to CC7 (eight) per signal. The eight through silicon vias TSV3 are cyclically connected as shown in FIG. 6. FIG. 6 shows surface bumps 85 in solid lines and rear bumps 84 in broken lines. As shown in FIG. 6, the cyclic connection of the through silicon vias TSV3 makes it possible to supply individual data from the interface chip IF to the respective core chips CC0 to CC7 with the core chips CC0 to CC7 identical in circuit configuration.

For example, if internal circuit 6 are connected to the positions of the rear bumps 84-7, signals supplied from the interface chip IF to the rear bumps 84-0 to 84-7 of the lowermost core chip CC7 are selectively supplied to the internal circuits 6 of the core chips CC0 to CC7, respectively.

Figure 7:
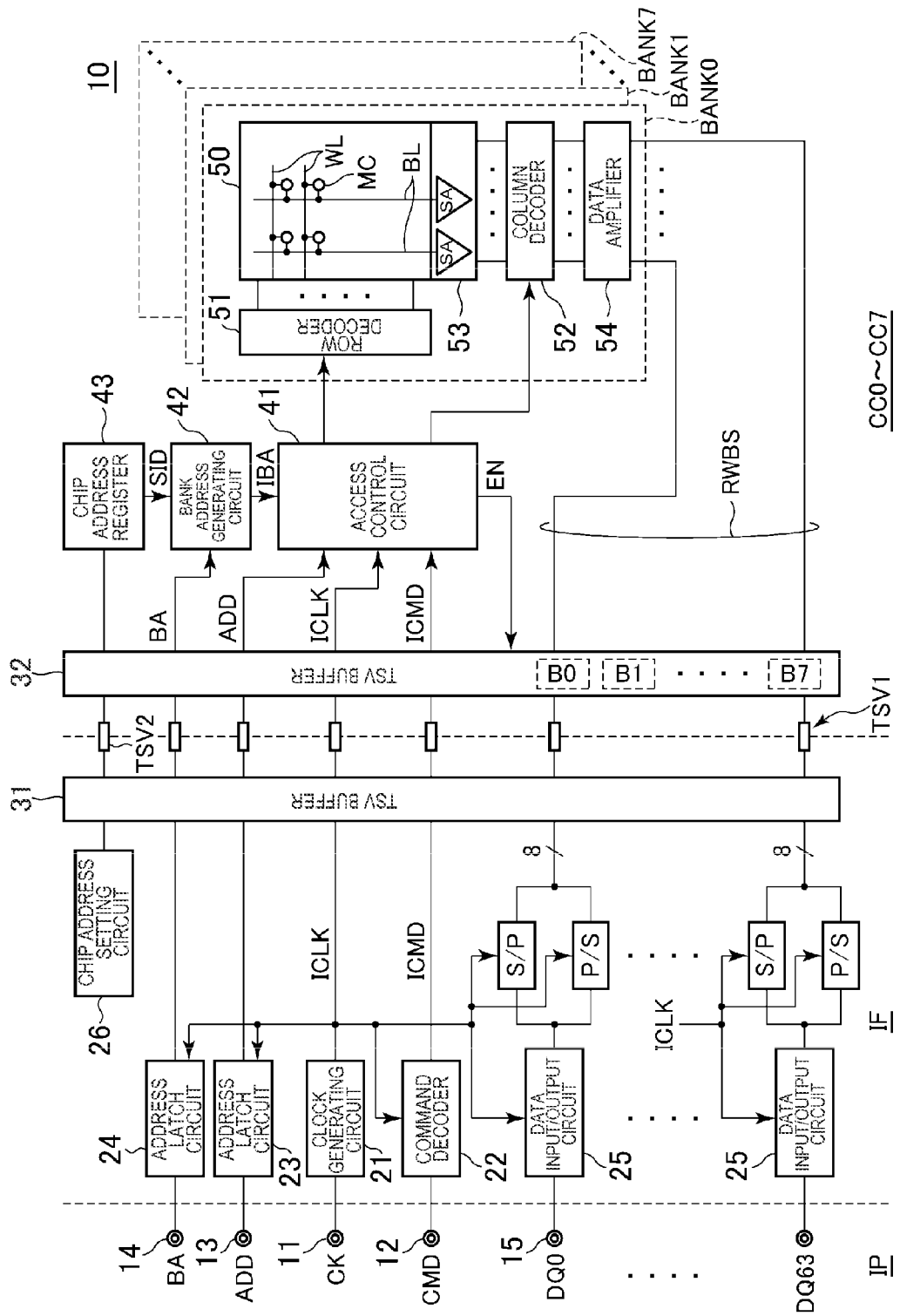
FIG. 7 is a block diagram showing the configuration of essential parts of the semiconductor device 10 according to the embodiment of the present invention.

Turning to FIG. 7, the external terminals arranged on the interposer IP include a clock terminal 11, a command terminal 12, an address terminal 13, a bank address terminal 14, and data input/output terminals 15. The interposer IP also has other external terminals such as a data strobe terminal and power supply terminals, which are omitted from the diagram. All the external terminals excluding power supply terminals are connected to the interface chip IF, not directly to the core chips CC0 to CC7.

The clock terminal 11 is supplied with an external clock signal CK. The external clock signal CK is supplied to a clock generating circuit 21. The clock generating circuit 21 generates an internal clock signal ICLK. The internal clock signal ICLK is supplied to various circuit blocks in the interface chip IF, as well as to the core chips CC0 to CC7 through a TSV buffer 31.

The command terminal 12 is supplied with command signals CMD including a row address strobe signal RASB, a column address strobe signal CASB, and a write enable signal WEB. The command signals CMD are supplied to a command decoder 22. The command decoder 22 decodes the command signals CMD to generate an internal command signal ICMD. The internal command signal ICMD is supplied to the core chips CC0 to CC7 through the TSV buffer 31.

The address terminal 13 is supplied with an address signal ADD. The bank address terminal 14 is supplied with a bank address BA. The address signal ADD and bank address BA are latched by address latch circuits 23 and 24, respectively, and supplied to the core chips CC0 to CC7 through the TSV buffer 31.

The data input/output terminals 15 are terminals for outputting read data and inputting write data. In the present embodiment, the data input/output terminals 15 include sixty-four terminals DQ0 to DQ63. Each of the data input/output terminals 15 is connected to a parallel-to-serial conversion circuit P/S and a serial-to-parallel conversion circuit S/P through a data input/output circuit 25. In a read operation, parallel read data output from the core chips CC0 to CC7 through the TSV buffer 31 is converted into serial data by the parallel-to-serial conversion circuits P/S, and burst out through the sixty-four data input/output terminals 15. In a write operation, write data serially burst in from the sixty-four data input/output terminals 15 is converted into parallel data by the serial-to-parallel conversion circuits S/P, and output to the core chips CC0 to CC7 through the TSV buffer 31.

In the present embodiment, the core chips CC0 to CC7 are composed of the back end sections of DDR3 (Double Data Rate 3) DRAMs with a prefetch number of eight bits. More specifically, the parallel-to-serial conversion circuits P/S perform parallel-to-serial conversion of eight bits per data input/output terminal 15. The serial-to-parallel conversion circuits S/P perform serial-to-parallel conversion of eight bits per data input/output terminal 15. The number of bits of data to be simultaneously input/output between the interface chip IF and the core chips CC0 to CC7 is thus 512, and 512 through silicon vias TSV1 are used for data transfer. The other through silicon vias TSV1 shown in FIG. 7 include ones that transmit the address signal ADD, the bank address BA, the internal command signal ICMD, and the internal clock signal ICLK. Such through silicon vias are through silicon vias TSV1 of the type shown in FIG. 2A. This means that the address signal ADD, the bank address BA, the internal command signal ICMD, and the like are supplied from the interface chip IF to the core chips CC0 to CC7 in common.

As shown in FIG. 7, the address signal ADD, the internal command signal ICMD, and the internal clock signal ICLK are supplied from the interface chip IF to an access control circuit 41 in each of the core chips CC0 to CC7 via through silicon vias TSV1 and a TSV buffer 32. Meanwhile, the bank address BA is not directly supplied to the access control circuit 41, but is converted into an internal bank address IBA by a bank address generating circuit 42 before supplied to the access control circuit 41. The bank address generating circuit 42 generates the internal bank address IBA through an operation using the bank address BA supplied from the interface chip IF and a chip address SID retained in a chip address register 43. A detailed example of the bank address generating circuit 42 will be described later.

The chip address register 43 retains a chip address SID which is different from one another to the respective core chips CC0 to CC7. To assign different chip addresses SID to the respective core chips CC0 to CC7, through silicon vias TSV2 of the type shown in FIG. 2B or through silicon vias TSV3 of the type shown in FIG. 2C need to be used. For example, through silicon vias TSV2 of the type shown 2B may be used with a chip address setting circuit 26 in the interface chip IF. Different data can be given to the internal circuits 5 of the respective core chips CC0 to CC7 by transferring 3-bit data from upper to lower layers (or lower to upper layers) while incrementing the data by the internal circuits 5. The respective pieces of data can be latched by the chip address registers 43 as the different chip addresses SID assigned to the core chips CC0 to CC7.

The access control circuit 41 performs row access control and column access control based on various types of signals supplied thereto. Specifically, if the internal command signal ICMD indicates an active command, the address signal ADD is supplied to a row decoder 51. The row decoder 51 then selects a word line WL specified by the address signal ADD, whereby a row access is performed. If the internal command signal ICMD indicates a read command or write command, the address signal ADD is supplied to a column decoder 52. The column decoder 52 selects sense amplifiers SA in a sense circuit 53 that are specified by the address signal ADD, whereby a column access is performed.

A memory cell array 50 includes a plurality of word lines WL and a plurality of bit lines BL. The memory cells MC are arranged at the intersections of the word lines WL and the bit lines BL. The bit lines BL are connected to respective corresponding sense amplifiers SA. In a read operation, read data amplified by sense amplifiers SA are further amplified by a data amplifier 54 and supplied to the TSV buffer 32 through a read/write bus RWBS. In a write operation, write data supplied through the TSV buffer 32 and the read/write bus RWBS are supplied to selected bit lines BL through the data amplifier 54.

In the present embodiment, the memory cell array 50 has an eight-bank configuration. Which memory bank to access is specified by the internal bank address IBA. A memory bank is the unit to be issued commands. The memory banks are capable of interleaving operations. In the present invention, it is important that the memory banks are selected not by the bank address BA that is supplied from outside, but by the internal bank address IBA that is generated inside. Based on the internal bank address IBA, the access control circuit 41 also supplies an enable signal EN to the TSV buffer 32. The enable signal EN is a signal for activating any one of TSV buffers B0 to B7 that are assigned to the through silicon vias TSV1 for data transfer. The TSV buffers B0 to B7 correspond to the respective memory banks to be selected by the internal bank address IBA.

Figure 8:
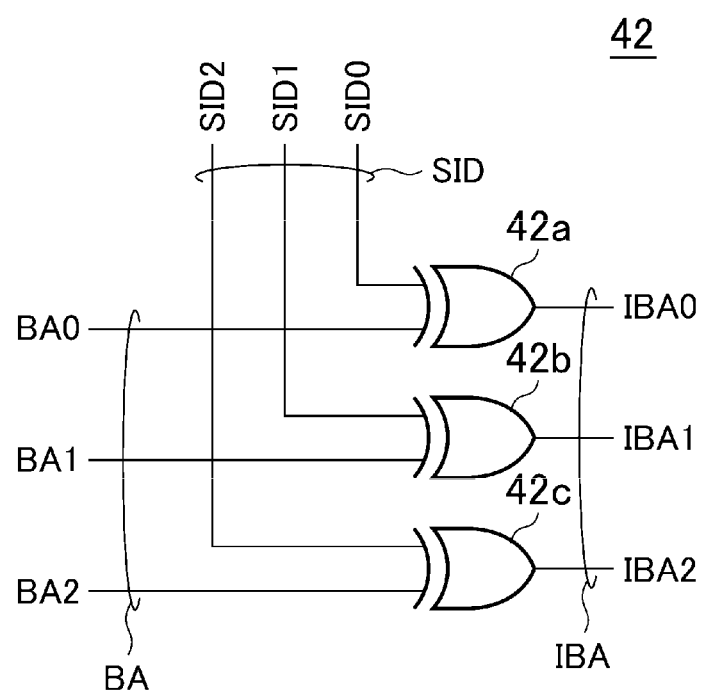
FIG. 8 is a circuit diagram of the bank address generating circuit shown in FIG. 7.

Turning to FIG. 8, the bank address generating circuit 42 includes three exclusive OR circuits (EOR circuits) 42a to 42c. The EOR circuit 42a receives a bit BA0 of the bank address BA and a bit SID0 of the chip address SID to generate a bit IBA0 of the internal bank address IBA. Similarly, the EOR circuit 42b receives a bit BA1 of the bank address BA and a bit SID1 of the chip address SID to generate a bit IBA1 of the internal bank address IBA. The EOR circuit 42c receives a bit BA2 of the bank address BA and a bit SID2 of the chip address SID to generate a bit IBA2 of the internal bank address IBA.

As described previously, the bank address BA is supplied to the core chips CC0 to CC7 in common. The core chips CC0 to CC7 are therefore given the same value. On the other hand, the chip address SID is assigned so that the core chips CC0 to CC7 have respective different values. The resulting internal bank address IBA therefore has different values in the respective core chips CC0 to CC7. It should be appreciated that the bits to be supplied to the EOR circuits 42a to 42c are not limited to the foregoing combination. Any bits of the bank address BA and any bits of the chip address SID may be supplied to the EOR circuits 42a to 42c.

Figure 9:
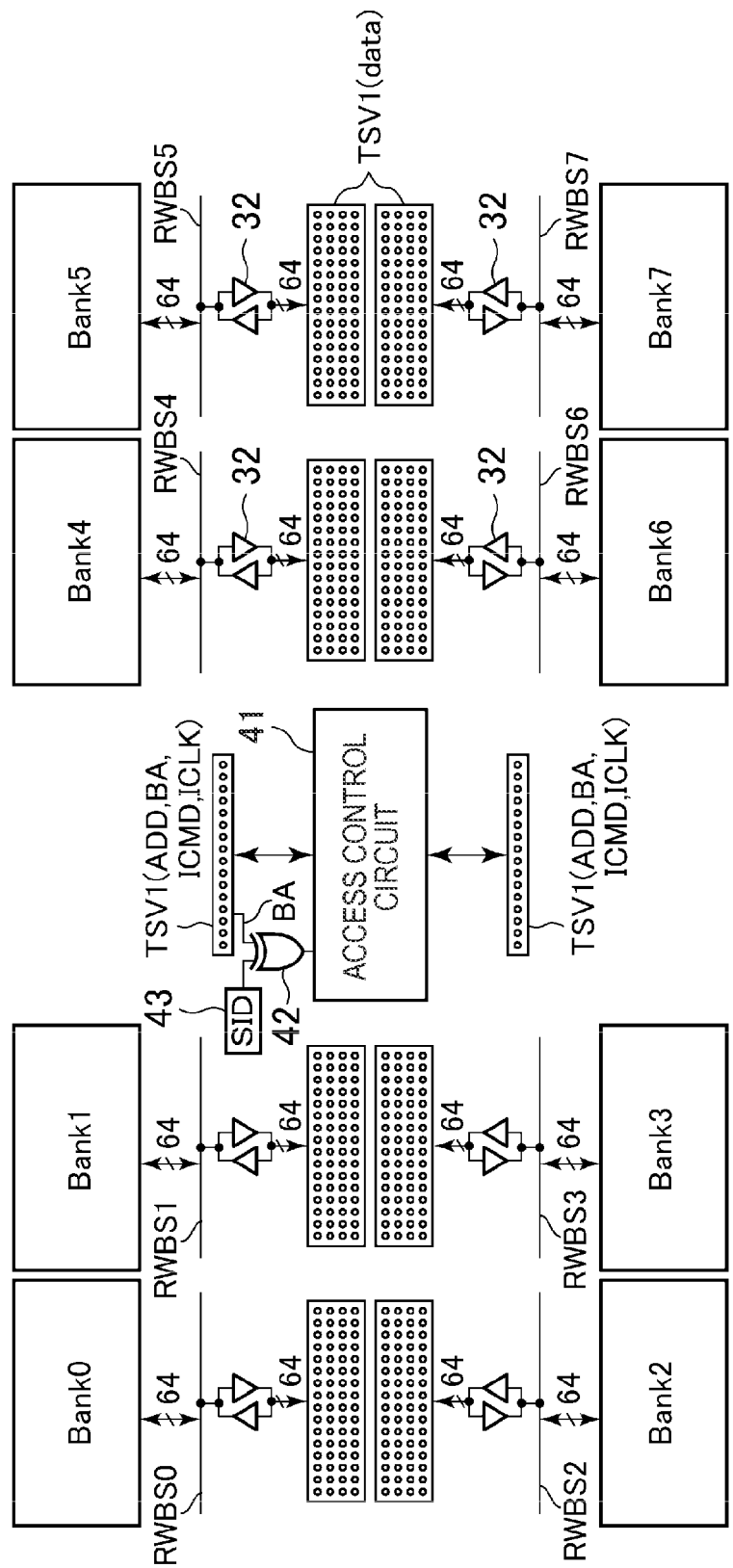
FIG. 9 is a schematic diagram for explaining the relationship between the memory banks, the read/write buses RWBS, and the through silicon vias TSV1 (data) for data transfer.

FIG. 9 shows the layout of the core chips CC0 to CC7 as seen in the stacking direction. As shown in FIG. 9, the memory banks Bank0 to Bank7 are laid out in respective different planar positions, with respective dedicated read/write buses RWBS0 to RWBS7 assigned thereto. In the present embodiment, eight data input/output terminals 15 are assigned for each of the core chips CC0 to CC7, with 8-bit prefetch operations. The number of bits of data to be input/output into/from a single core chip CC0 to CC7 by a single access is thus sixty-four. The read/write buses RWBS0 to RWBS7 each have a data width of sixty-four bits, and input/output sixty-four bits of data by a single access.

In a read operation, read data that is read from a selected memory bank is then transferred to the interface chip IF through the read/write bus RWBS dedicated to the memory bank and through the through silicon vias TSV1 (data) for data transfer dedicated to the memory bank. In a write operation, write data is transferred from the interface chip IF to the selected memory bank through the dedicated through silicon vias TSV1 (data) for data transfer. The transferred write data are supplied to the selected memory bank through the dedicated read/write bus RWBS.

In the core chips CC0 to CC7, respective different memory banks are selected by the operation of the bank address generating circuits 42. The eight core chips CC0 to CC7 therefore use respective different through silicon vias TSV1(data) for data transfer to transfer read data or write data.

Figure 10:
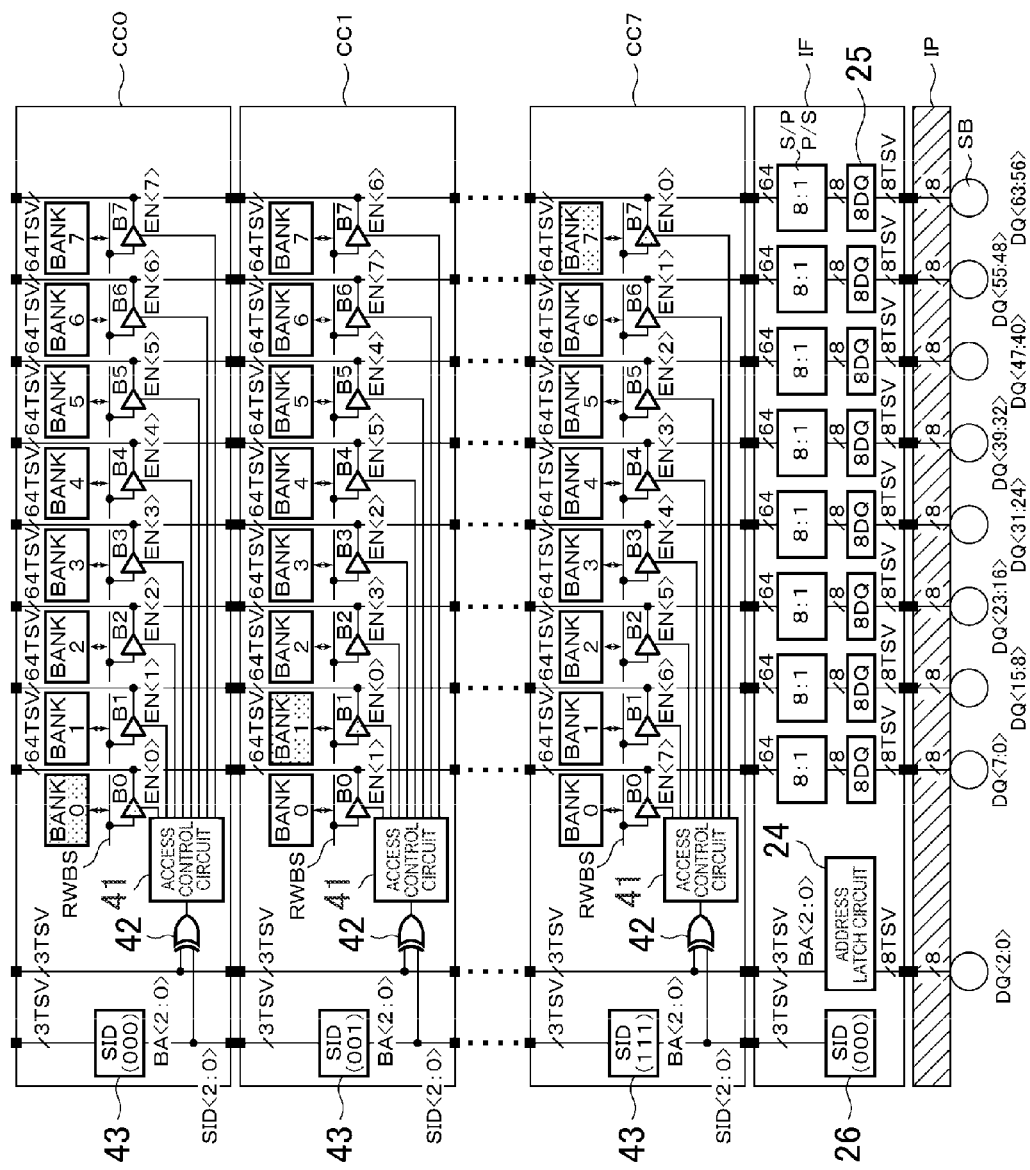
FIG. 10 is a schematic diagram for explaining the operation of the semiconductor device 10 according to the embodiment of the present invention.

FIG. 10 shows a read operation where the bank address BA is (000). As shown in FIG. 10, if the bank address BA is (000), the core chips CC0 to CC7 generate internal bank addresses IBA of (000) to (111), respectively. It follows that the memory banks to be actually accessed in the core chips CC0 to CC7 are the memory banks Bank0 to Bank7, respectively. The memory banks to be accessed are shown shaded in FIG. 10.

Enable signals EN0 to EN7 are activated in the core chips CC0 to CC7 according to the generated internal bank addresses IBA, respectively, thereby read data is transferred via respective different through silicon vias TSV1. There occurs no data conflict on the through silicon vias TSV1, and the 512 bits of read data is simultaneously transferred to the interface chip IF. The read data transferred to the interface chip IF is converted into serial data by the parallel-to-serial conversion circuits P/S before burst out through the sixty-four data input/output terminals 15. A write operation is performed in a reverse manner.

As described above, according to the present embodiment, a bank address BA supplied from outside is converted into internal bank addresses IBA in the respective core chips CC0 to CC7. The internal bank addresses IBA are used as actual bank addresses. Memory banks formed in respective different planar positions can thus be accessed even with the same logical bank address as seen from outside. This can prevent data conflict on the through silicon vias TSV1 for data transfer. In addition, since the memory banks to be accessed in the eight core chips CC0 to CC7 formed in respective different planar positions, the heat-producing positions during operation are two-dimensionally distributed to suppress a local temperature increase.

Figure 11:
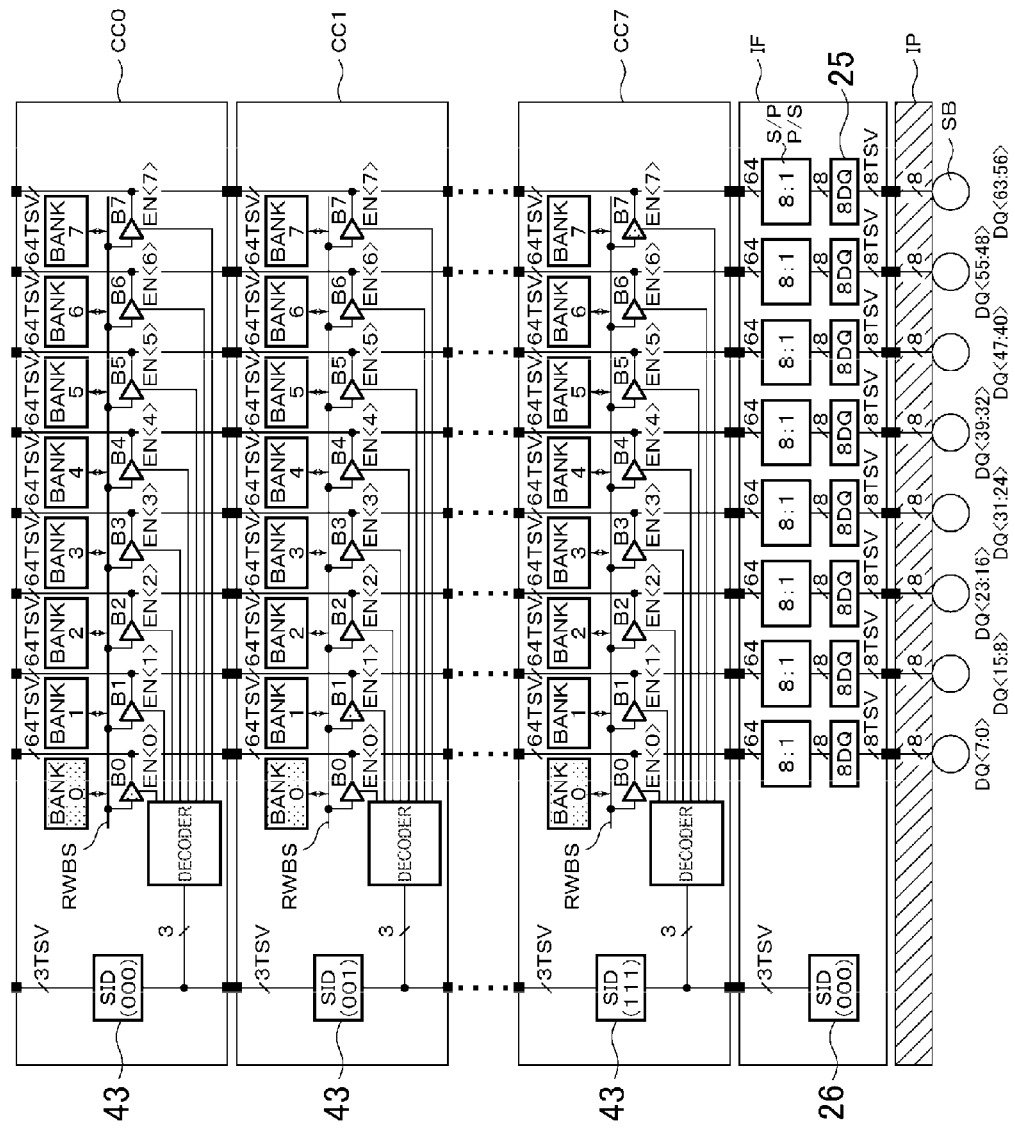
FIG. 11 is a schematic diagram for explaining the operation of a semiconductor device according to a comparative example.

Similar to FIG. 10, FIG. 11 shows a read operation where the bank address BA is (000). In the example shown in FIG. 11, the bank address BA supplied from the interface chip IF is simply used to access the core chips CC0 to CC7. If the bank address BA is (000), then the memory banks to be accessed in the core chips CC0 to CC7 are all Bank0. To avoid data conflict on the through silicon vias TSV1 (data) for data transfer, the read data read from the memory banks Bank0 need to be assigned to through silicon vias TSV1 (data) that differ from one of the core chips CC0 to CC7 to another. In the example shown in FIG. 11, enable signals EN are generated by using the chip addresses SID, and the read data in the core chips CC0 to CC7 are thereby distributed to different through silicon vias TSV1.

Figure 12:
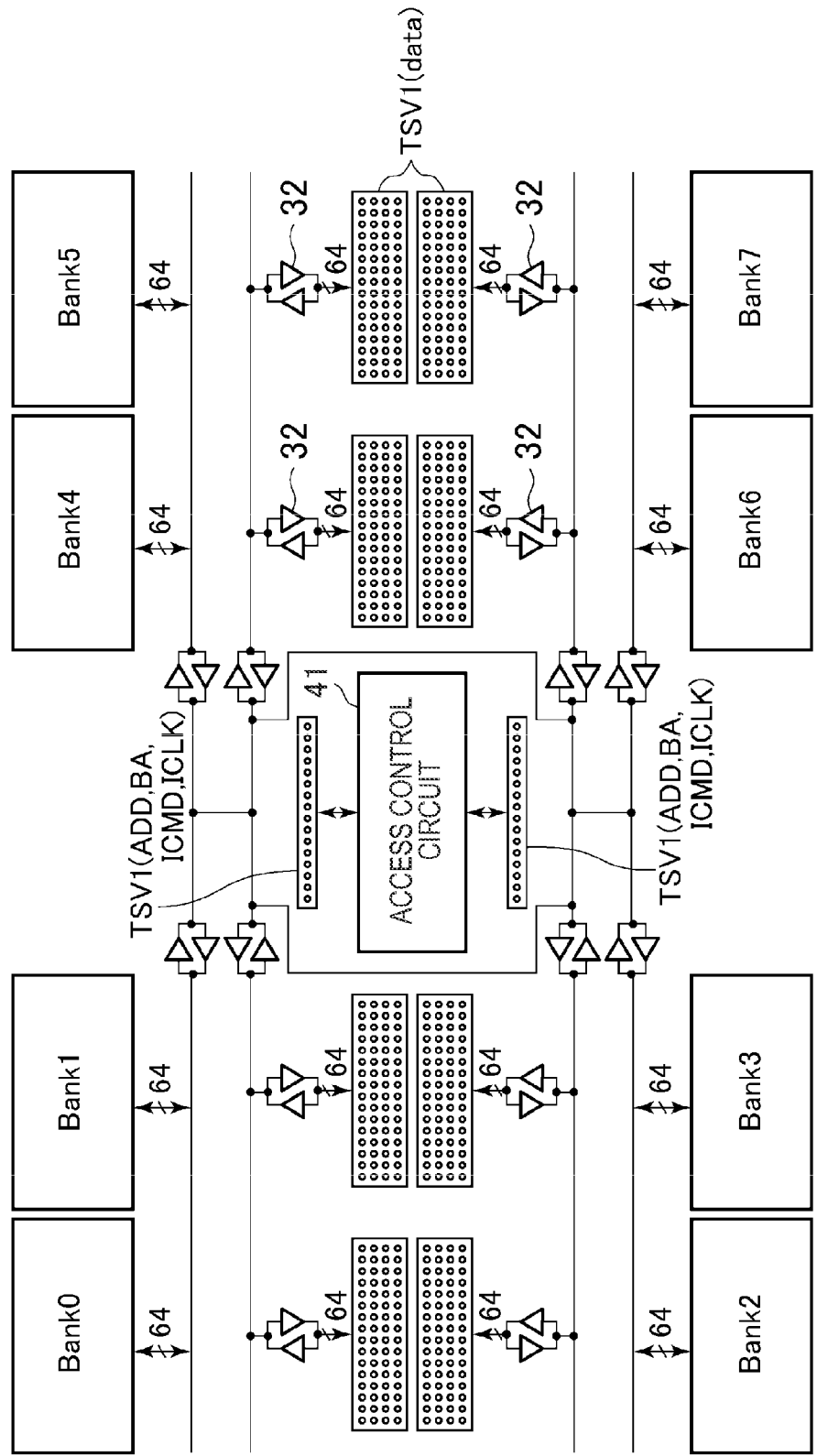
FIG. 12 is a schematic diagram for explaining the configuration of the core chips CC0 to CC7 that is intended to implement the function of FIG. 11.

FIG. 12 shows the layout of the core chips CC0 to CC7 as seen in the stacking direction. As shown in FIG. 12, the implementation of the function of FIG. 11 requires that read data read from arbitrary memory banks Bank0 to Bank7 be able to be supplied to arbitrary through silicon vias TSV1 (data). To match the input and output timing of 512 bits of data, read/write buses RWBS also need to be formed in equal wiring lengths regardless of the planar relationship between the memory banks selected and the through silicon vias TSV1 (data) selected. Consequently, as shown in FIG. 12, read/write buses RWBS for collecting read data read from the memory banks Bank0 to Bank7 to a chip center once and read/write buses RWBS for distributing the read data collected to the center to the through silicon vias TSV1(data) are both needed. This increases the number of lines of the wiring and the wiring lengths as compared to the present embodiment.

In contrast, the present embodiment can minimize the number of read/write buses RWBS and the wiring lengths without the foregoing problem.

Figure 13:
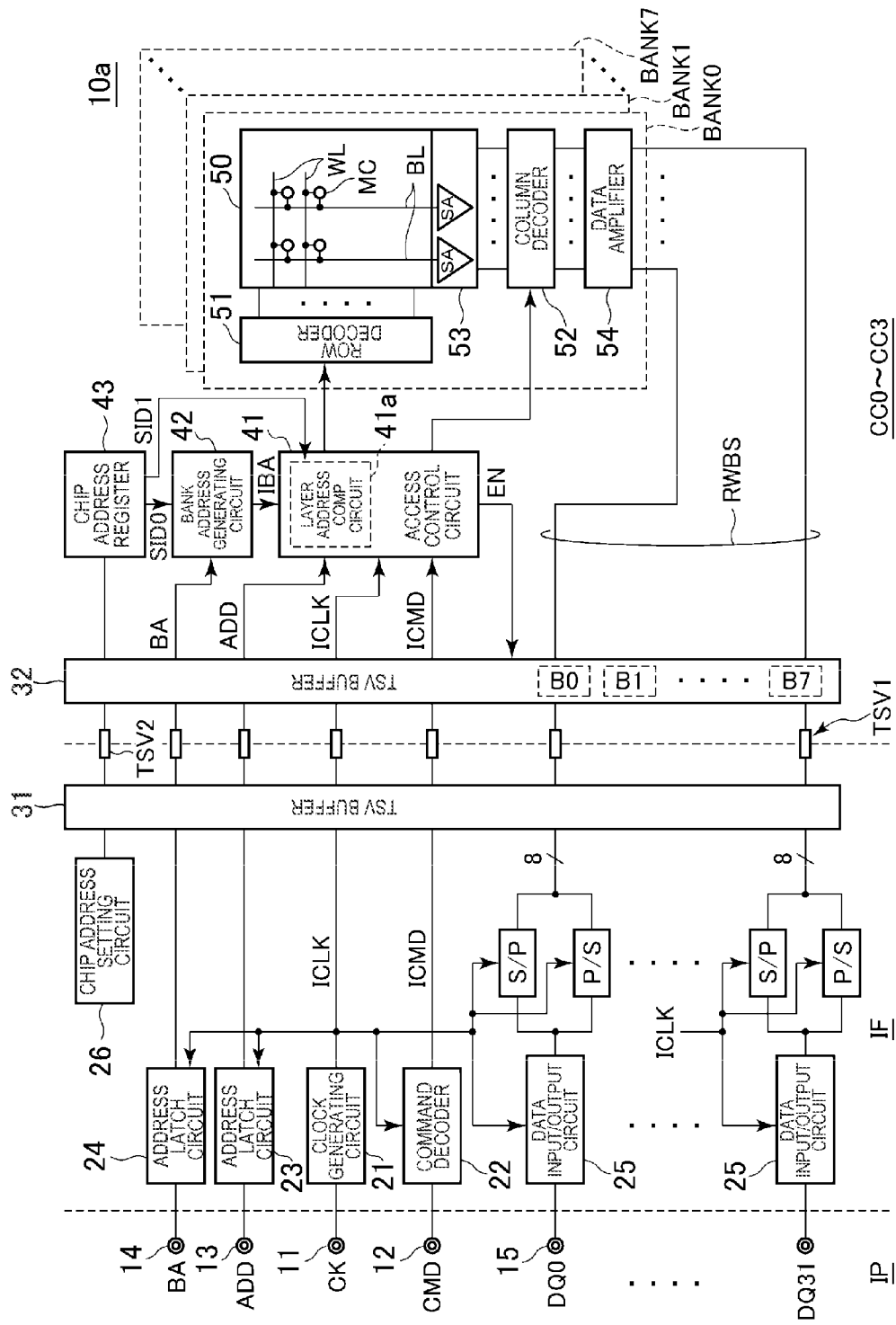
FIG. 13 is a block diagram showing the configuration of a semiconductor device 10a according to a second embodiment of the present invention.

Turning to FIG. 13, the semiconductor device 10a according to the second embodiment is different from the foregoing embodiment in that the number of core chips stacked is four and two of the core chips are simultaneously selected by a single access. With such a difference, the access control circuit 41, the bank address generating circuit 42, and the chip address register 43 are accordingly modified in configuration. In the present embodiment, the number of bits of data to be simultaneously input/output into/from a core chip by a single access is 128 (=16×8). The number of data input/output terminals 15 is thirty-two. In other respects, the present embodiment is basically the same as the foregoing embodiment. The same components will thus be designated by like reference numerals, and redundant description will be omitted.

In the present embodiment, the number of bits of the chip address SID stored in the chip address register 43 is two since the number of core chips stacked is four. The upper bit SID1 of the chip address SID is supplied to a layer address comparison circuit 41a which is included in the access control circuit 41. The lower bit SID0 of the chip address SID is supplied to the bank address generating circuit 42.

Figure 14:
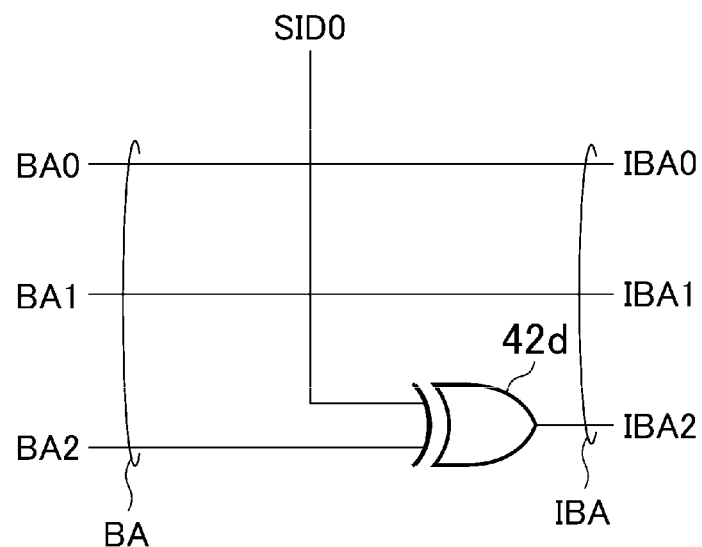
FIG. 14 is a circuit diagram of the bank address generating circuit 42 shown in FIG. 13.

Turning to FIG. 14, the bank address generating circuit 42 according to the present embodiment includes an EOR circuit 42d which receives the bit BA2 of the bank address BA and the bit SID0 of the chip address SID to generate the bit IBA2 of the internal bank address IBA. The other bits BA0 and BA1 of the bank address BA are simply output as the bits IBA0 and IBA1 of the internal bank address IBA. With such a configuration, the bank address BA is simply output as the internal bank address IBA in the even-numbered core chips CC0 and CC2. In the odd-numbered core chips CC1 and CC3, the bank address BA is output as the internal bank address IBA with only the most significant bit BA2 inverted.

Figure 15:
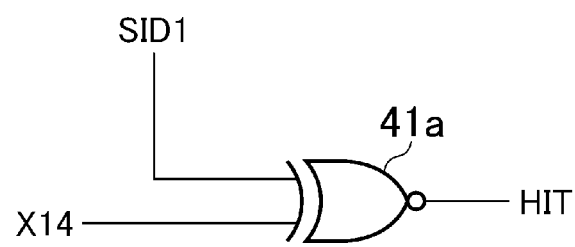
FIG. 15 is a circuit diagram of the layer address comparison circuit 41a shown in FIG. 13.

Turning to FIG. 15, the layer address comparison circuit 41a includes an ENOR circuit that receives one bit (X14) of the address signal ADD and the bit SID1 of the chip address SID to generate a hit signal HIT. The hit signal HIT is a signal for activating the access control circuit 41. The access control circuit 41 is activated only in core chips where the hit signal HIT is at a high level. With such a configuration, the lower two core chips CC0 and CC1 are selected when X14 is at a low level. The upper two core chips CC2 and CC3 are selected when X14 is at a high level.

Figure 16:
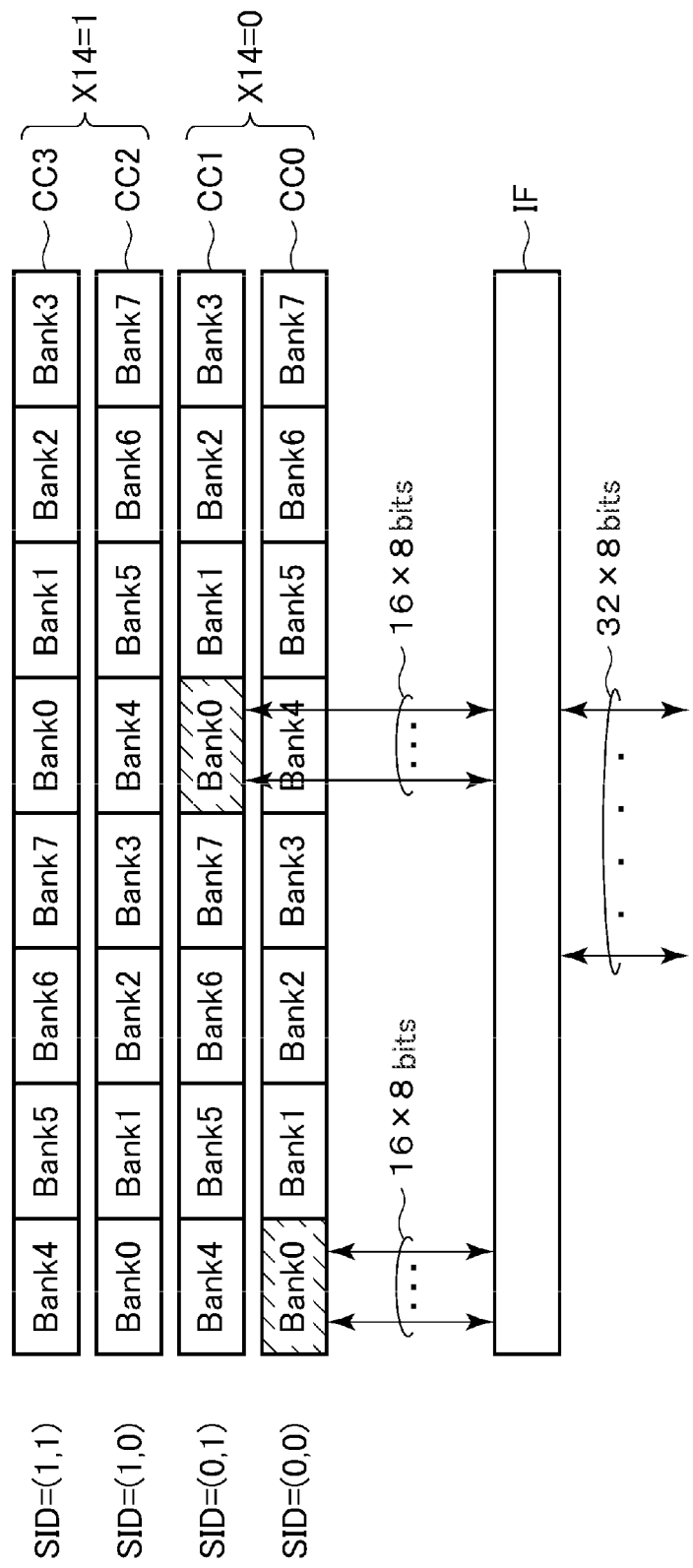
FIG. 16 is a schematic diagram for explaining the logical arrangement of bank addresses in the core chips CC0 to CC3 according to the second embodiment.

Turning to FIG. 16, according to the present embodiment, the even-numbered core chips CC0 and CC2 have bank addresses of the same logical arrangement. The odd-numbered core chips CC1 and CC3 have bank addresses of the same logical arrangement. The even-numbered core chips CC0 and CC2 will not be simultaneously selected, nor will the odd-numbered core chips CC1 and CC3 be simultaneously selected. Instead, one of the even-numbered core chips CC0 and CC2 and one of the odd-numbered core chips CC1 and CC3 are always selected at the same time. In the example shown in FIG. 16, the core chips CC0 and CC1 are accessed for Bank0. The accessed core chips CC0 and CC1 each input/output 128 bits of data at the same time. Since the memory banks of the two simultaneously-selected core chips are located at respective different planar positions, the data are input/output by the intervention of through silicon vias TSV1 provided at different planar positions.

According to the present embodiment, not all the stacked core chips CC0 to CC3 are simultaneously selected, but only one half the core chips are selected at a time. The memory banks to be accessed in the two simultaneously-selected core chips are located at different planar positions. It is therefore possible to provide the same effect as in the foregoing embodiment.

As described above, the present invention is even applicable to the case where all the increase in storage capacity due to the stacking of memory chips is not allocated to extend the data input/output width, but one half the increase in storage capacity is allocated to extend the data input/output width and the remaining half to address extension as in the second embodiment.

It is apparent that the present invention is not limited to the above embodiments, but may be modified and changed without departing from the scope and spirit of the invention.

For example, in the present invention, the circuit configuration of the bank address generating circuit 42 is not limited to that of the circuit shown in FIG. 8. Other circuit configurations may be employed as long as the core chips CC0 to CC7 can generate respective different internal bank addresses IBA based on the bank address BA and the chip addresses SID. For example, adders may be used instead of the exclusive OR circuits.

In the present invention, the interface chip IF is used to perform parallel-to-serial conversions on read data and serial-to-parallel conversions on write data. However, part or all of the parallel-to-serial conversions and serial-to-parallel conversions may be performed on the memory chip side. If all the parallel-to-serial conversions and serial-to-parallel conversions are performed on the memory chip side, the interface chip IF may be omitted.

What is claimed is:
1. A semiconductor device comprising:
a plurality of memory chips arranged in a stacked arrangement, wherein each of the memory chips includes a plurality of memory banks and a plurality of data buses each transferring data to/from an associated one of the memory banks, and a plurality of penetration electrodes penetrating through the memory chip and each transferring the data to/from an associated one of the data buses;
wherein the plurality of memory chips are configured to receive an address signal in common, the address signal indicating an address value, and wherein the plurality of memory chips includes a first memory chip and a second memory chip, the first and second memory chips being configured to be simultaneously selected based on the address value, and wherein each of the first and second memory chips are configured to transfer the data by corresponding penetration electrodes in parallel when simultaneously selected.

2. The semiconductor device of claim 1, wherein the plurality of memory banks of the first memory chip and the plurality of banks of the second memory chip are arranged in different logical arrangements.

3. The semiconductor device of claim 2, wherein, when the first and second memory chips are simultaneously selected, an activated memory bank of the first memory chip from/to which the data is transferred and an activated memory bank of the second memory chip from/to which the data is transferred are arranged at different positions as seen in the stacking direction.

4. The semiconductor device of claim 1, wherein each of the plurality of memory chips has a corresponding chip address information comprising a plurality of bits, and wherein a same-ordered first bit of the chip address information corresponding to the first memory chip and to the second memory chip are compared with the address signal to determine whether the first memory chip and the second memory chip are to be simultaneously selected.

5. The semiconductor device of claim 4, wherein, when the first and second memory chips are simultaneously selected, a same-ordered second bit of the chip address information corresponding to the first memory chip and to the second memory chip is compared to a bank address signal supplied in common to the memory chips to determine at least one bank of the first memory chip and at least one bank of the second memory chip to activate for transfer of the data.

6. The semiconductor device of claim 4, wherein each of the memory chips further includes a chip address register configured to store the chip address information, and the chip address registers included in the memory chips are serially connected by other penetration electrodes.

7. The semiconductor device of claim 1, wherein the data transferred to/from the first and second memory chips is received in parallel by an interface chip that is arranged to be stacked with the plurality of memory chips.

8. The semiconductor device of claim 1, wherein the first and second memory chips are a portion of the plurality of memory chips.

9. The semiconductor device of claim 1, wherein the first and second memory chips are arranged directly adjacent to each other in the stacked arrangement.

10. The semiconductor device of claim 1, comprising:
an interface chip that controls the memory chips, wherein the interface chip converts the data supplied from the memory chips via the penetration electrodes from parallel to serial and outputs the data serial converted to outside, and the interface chip converts the data supplied from outside from serial to parallel and outputs the data parallel converted to the memory chips via the penetration electrodes.

11. The semiconductor device of claim 1, wherein the plurality of memory chips comprises a third memory chip and a fourth memory chip that are not selected based on the address value when the first and second memory chips are simultaneously selected.

* * * * *

UNITED STATES PATENT AND TRADEMARK OFFICE
CERTIFICATE OF CORRECTION

| | | |
|---|---|---|
| PATENT NO. | : 9,252,081 B2 | Page 1 of 1 |
| APPLICATION NO. | : 14/560493 | |
| DATED | : February 2, 2016 | |
| INVENTOR(S) | : Akira Ide | |

It is certified that error appears in the above-identified patent and that said Letters Patent is hereby corrected as shown below:

In the Claims

Claim 10, Column 12, lines 22-26 should read: "allel to serial data and outputs the serial data to outside, and the interface chip converts the serial data supplied from outside from serial to parallel data and outputs the parallel data to the memory chips via the penetration electrodes."

Signed and Sealed this
Twenty-fourth Day of May, 2016

Michelle K. Lee
*Director of the United States Patent and Trademark Office*